US008150050B2

(12) United States Patent
Lee et al.

(10) Patent No.: US 8,150,050 B2
(45) Date of Patent: Apr. 3, 2012

(54) BASS ENHANCING APPARATUS AND METHOD

(75) Inventors: Jun-soo Lee, Suwon-si (KR); Naoyuki Kato, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 1163 days.

(21) Appl. No.: 11/944,805

(22) Filed: Nov. 26, 2007

(65) Prior Publication Data

US 2008/0175409 A1 Jul. 24, 2008

(30) Foreign Application Priority Data

Jan. 18, 2007 (KR) ........................ 10-2007-0005670

(51) Int. Cl.
*H03G 5/00* (2006.01)

(52) U.S. Cl. ............................. 381/61; 381/98; 381/103

(58) Field of Classification Search .................... 381/98, 381/61, 103
See application file for complete search history.

(56) References Cited

U.S. PATENT DOCUMENTS

| | | | | |
|---|---|---|---|---|
| 5,129,003 | A * | 7/1992 | Saruta | 381/71.3 |
| 6,285,767 | B1 * | 9/2001 | Klayman | 381/17 |
| 6,570,078 | B2 * | 5/2003 | Ludwig | 84/600 |
| 6,610,917 | B2 * | 8/2003 | Ludwig | 84/726 |
| 6,689,947 | B2 * | 2/2004 | Ludwig | 84/721 |
| 6,849,795 | B2 * | 2/2005 | Ludwig | 84/661 |
| 6,852,919 | B2 * | 2/2005 | Ludwig | 84/735 |
| 7,003,120 | B1 * | 2/2006 | Smith et al. | 381/61 |
| 7,038,123 | B2 * | 5/2006 | Ludwig | 84/723 |
| 7,217,878 | B2 * | 5/2007 | Ludwig | 84/609 |
| 7,309,828 | B2 * | 12/2007 | Ludwig | 84/622 |
| 7,309,829 | B1 * | 12/2007 | Ludwig | 84/622 |
| 7,408,108 | B2 * | 8/2008 | Ludwig | 84/719 |
| 7,412,220 | B2 * | 8/2008 | Beyer | 455/222 |
| 7,507,902 | B2 * | 3/2009 | Ludwig | 84/723 |
| 7,638,704 | B2 * | 12/2009 | Ludwig | 84/672 |
| 7,652,208 | B1 * | 1/2010 | Ludwig | 84/625 |
| 7,676,043 | B1 * | 3/2010 | Tsutsui et al. | 381/1 |
| 7,715,573 | B1 * | 5/2010 | Yonemoto et al. | 381/98 |
| 7,759,571 | B2 * | 7/2010 | Ludwig | 84/723 |
| 7,767,902 | B2 * | 8/2010 | Ludwig | 84/741 |
| 7,786,370 | B2 * | 8/2010 | Ludwig | 84/645 |
| 7,960,640 | B2 * | 6/2011 | Ludwig | 84/735 |
| 2001/0033667 | A1 | 10/2001 | Behringer et al. | |

(Continued)

FOREIGN PATENT DOCUMENTS

EP 1947903 A1 * 7/2008

(Continued)

OTHER PUBLICATIONS

Office Action issued in corresponding European Patent Application No. 07121884.6 dated May 6, 2008.

*Primary Examiner* — Laura Menz

(74) *Attorney, Agent, or Firm* — Jefferson IP Law, LLP

(57) ABSTRACT

A bass enhancing apparatus and method for enhancing bass include generating harmonics of the bass when an input signal is reproduced using a miniaturized speaker. The bass enhancing method includes extracting a bass component of an input signal, generating harmonics of the extracted bass component, synthesizing the generated harmonic signals and the input signal, and outputting the synthesizing result to an output terminal. The generating of the harmonics includes compressing a dynamic range of an amplitude level of each harmonic component at a predetermined distribution ratio.

11 Claims, 7 Drawing Sheets

U.S. PATENT DOCUMENTS

2005/0013446 A1 1/2005 Aarts
2005/0141727 A1 6/2005 Vierthaler
2005/0245221 A1* 11/2005 Beyer ............................ 455/222
2005/0265561 A1 12/2005 Manish et al.
2007/0140511 A1 6/2007 Lin et al.
2008/0175409 A1* 7/2008 Lee et al. ........................ 381/98
2009/0216353 A1* 8/2009 Van Reck ........................ 700/94
2010/0086148 A1* 4/2010 Hung et al. ..................... 381/98
2010/0232624 A1* 9/2010 Zhang ........................... 381/103

FOREIGN PATENT DOCUMENTS

WO WO 98/46044 10/1998

* cited by examiner

BASS ENHANCING APPARATUS AND METHOD

CROSS-REFERENCE TO RELATED APPLICATION

This application claims the benefits of Korean Application No. 2007-5670, filed on Jan. 18, 2007, in the Korean Intellectual Property Office, the disclosure of which is incorporated herein by reference.

BACKGROUND OF THE INVENTION

1. Field of the Invention

Aspects of the present invention relate to an audio reproduction apparatus, and more particularly, to a bass enhancing apparatus and method for enhancing bass by generating harmonics of the bass when a signal is reproduced using a miniaturized speaker.

2. Description of the Related Art

In common, audio data reproduced by a multimedia reproduction device, such as a Compact Disc (CD) player or a Digital Versatile Disc (DVD) player, is reproduced by a speaker. A user hears a sound output from the speaker. In this case, how faithfully an original sound is represented depends on the performance of the speaker and audio processing technology of the multimedia reproduction device. Meanwhile, according to the development of the audio processing technology, speakers are miniaturized. However, as the size of a speaker is smaller, it is limited to faithfully reproduce a bass sound.

Thus, a bass enhancing apparatus enhances a bass component, which is easy to be insufficient when an audio signal is reproduced using a miniaturized speaker.

A technique related to the bass enhancing apparatus is disclosed in a United States Patent Application Publication of Aarts, US 2005/0013446 (filed 12 Aug. 2004 entitled Audio System), and a United States Patent Application Publication of Manish et al., US 2005/0265561 (filed 9 May 2005 entitled Method and Apparatus to Generate Harmonics in Speaker Reproducing System).

FIG. 1 illustrates an embodiment of a conventional bass enhancing apparatus according to Aarts. Referring to FIG. 1, a signal received via an input terminal 91 is input to a bass component extractor 92. The bass component extractor 92 extracts a component belonging to bass in the input signal which cannot be reproduced. A harmonics generator 93 generates a second harmonic, a third harmonic through to an $n^{th}$ harmonic of the extracted bass component. An adder 96 adds the harmonics to the input signal and outputs the adding result to an output terminal 97.

An integer harmonics generation method can be implemented, for example, using a rectifier, an integrator, and a resetting circuit as illustrated in Manish et al.

However, the conventional bass enhancing apparatus generates harmonics by synthesizing signals having a fixed gain. Thus, when the conventional bass enhancing apparatus reproduces a signal having an excessive amplitude in the bass register through a miniaturized speaker, the dynamic range of which is limited by the size thereof, the signal is distorted.

SUMMARY OF THE INVENTION

Aspects of the present invention provide a bass enhancing apparatus and method to increase a bass enhancement effect in a common level duration and decrease signal distortion in a peak level duration by adjusting levels of harmonics generated from a bass component.

According to an aspect of the present invention, there is provided a bass enhancing method comprising: extracting a bass component of an input signal; generating harmonics of the extracted bass component; synthesizing the generated harmonic signals and the input signal; and outputting the synthesizing result to an output terminal. wherein the generating of the harmonics comprises compressing a dynamic range of an amplitude level of each harmonic component at a predetermined ratio.

According to an aspect of the present invention, there is provided a bass enhancing apparatus, comprising: a bass component extractor extracting to extract a bass component of an input signal; a harmonics generator generating to generate a plurality of harmonics of the bass component extracted by the bass component extractor and compressing to compress a dynamic range of an amplitude level of each harmonic component at a predetermined distribution ratio; and a first synthesizer synthesizing to synthesize the plurality of harmonic signals generated by the harmonics generator and the input signal.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
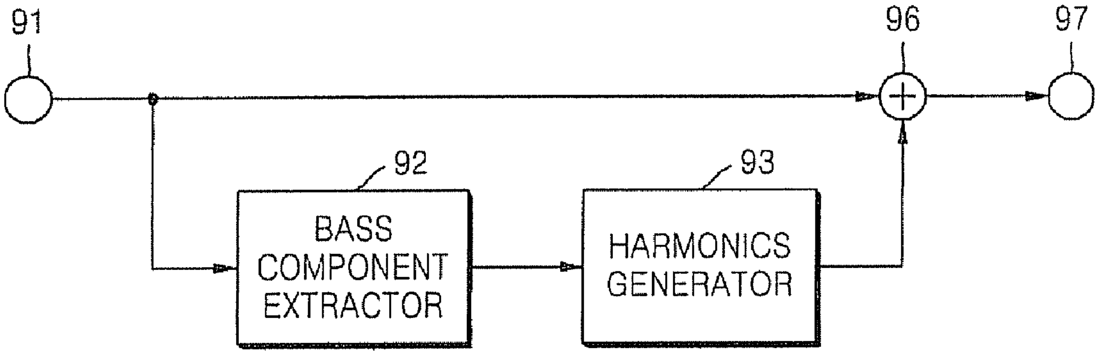
FIG. 1 (RELATED ART)
FIG. 1 is a block diagram of a conventional bass enhancing apparatus.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
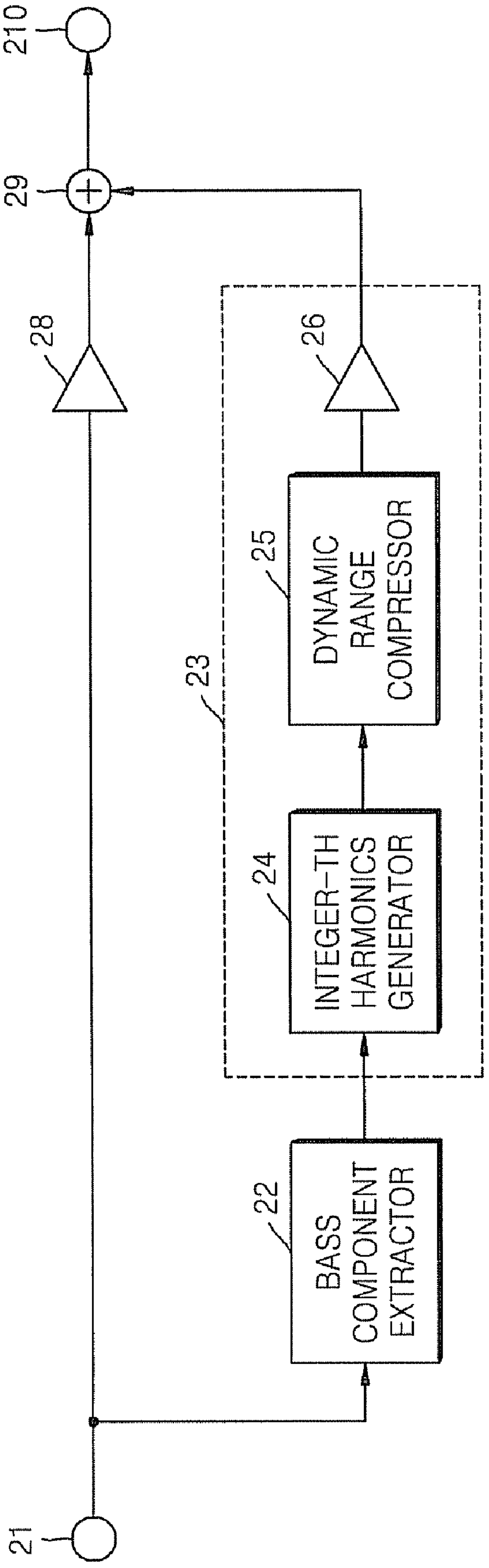
FIG. 2 is a block diagram of a bass enhancing apparatus according to aspects of the present invention.

FIG. 2 is a block diagram of a bass enhancing apparatus according to aspects of the present invention. Referring to FIG. 2, the bass enhancing apparatus includes a bass component extractor 22, a harmonics generator 23, a first gain adjuster 28, and an adder 29. The harmonics generator 23 includes an integer-th harmonics generator 24, a dynamic range compressor 25, and a second gain adjuster 26. The bass component extractor 22 extracts a bass component of a signal input from an input terminal 21. The bass component extractor 22 may use a low pass filter. The harmonics generator 23 generates integer-th harmonics (i.e., a second harmonic, a third harmonic, . . . , and an $n^{th}$ harmonic) of the extracted bass component and compresses a dynamic range of an amplitude level of each harmonic component at a predetermined distribution ratio. In more detail, the integer-th harmonics generator 24 generates the second harmonic, the third harmonic, . . . , and the $n^{th}$ harmonic of the bass component extracted by the bass component extractor 22. An integer harmonics generation method can be implemented using, for example, a rectifier, an integrator, and a resetting circuit.

The dynamic range compressor 25 compresses a level of a signal exceeding a dynamic range, i.e., compresses a dynamic range of an amplitude level of each harmonic component. For example, by compressing a signal having a dynamic range of 20 dB into a signal having a dynamic range of 10 dB, a range of signal variation is decreased or a gentle signal variation occurs. Thus, even if a high-peak signal is suddenly input, signal distortion does not occur. The second gain adjuster 26 adjusts a gain of each harmonic component output from the dynamic range compressor 25. The first gain adjuster 28 adjusts a gain of the signal input from the input terminal 21. An adder (not shown) adds the harmonic components output from the second gain adjuster 26. The adder 29 synthesizes each harmonic component generated by the harmonics generator 23 and the signal gain-adjusted by the first gain adjuster 28 and outputs the synthesizing result to an output terminal 210.

Figure 3:
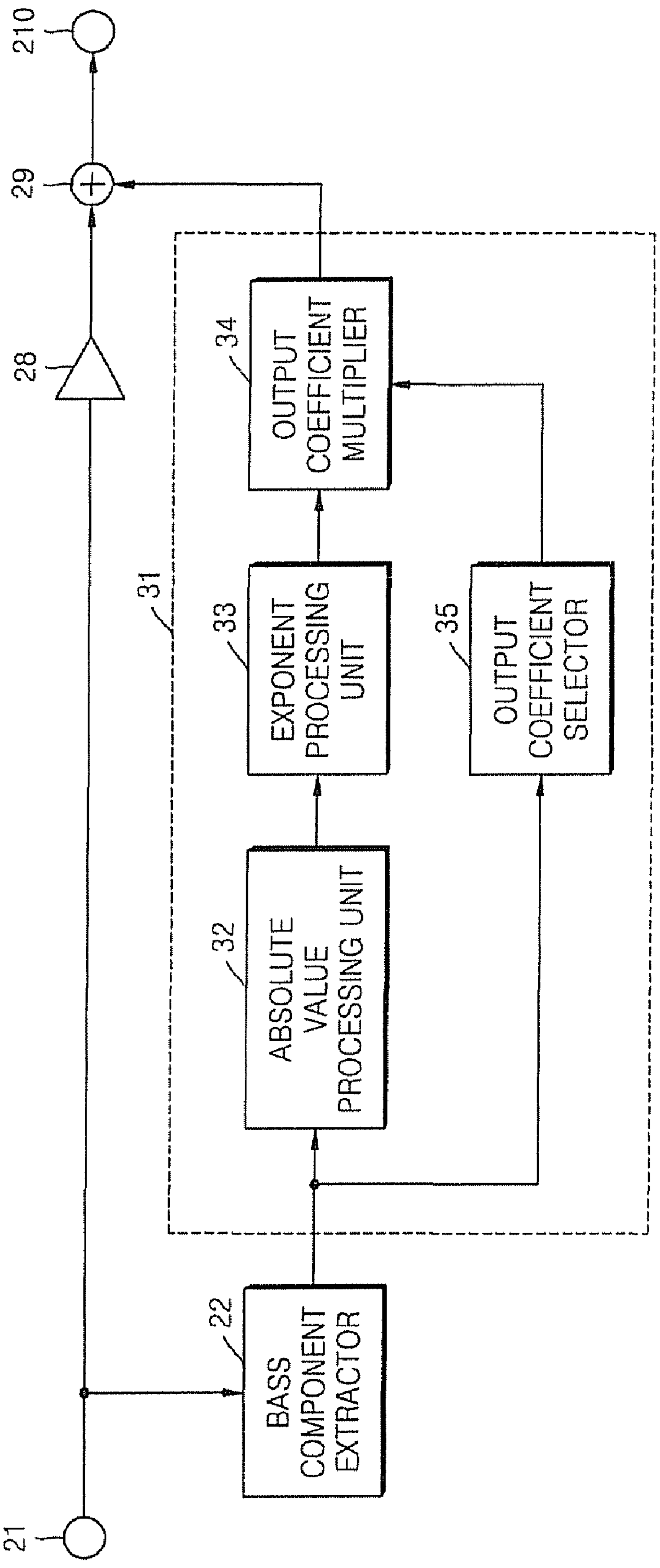
FIG. 3 is a block diagram of a bass enhancing apparatus according to aspects of the present invention.

FIG. 3 is a block diagram of a bass enhancing apparatus according to aspects of the present invention. The bass enhancing apparatus of FIG. 3 is similar to the bass enhancing apparatus of FIG. 2; however, the bass enhancing apparatus of FIG. 3 includes a harmonics generator 31 in order to reduce a circuit structure and increase precision, wherein the other blocks are the same as those of FIG. 2. That is, the harmonics generator 31 of FIG. 3 includes an absolute value processing unit 32, an exponent processing unit 33, an output coefficient multiplier 34, and an output coefficient selector 35.

The absolute value processing unit 32 obtains an absolute value of the amplitude of an input signal of the bass component extracted by the bass component extractor 22 from the signal input to the input terminal 21. The exponent processing unit 33 exponentiates the absolute value of the amplitude of the input signal from the bass component extracted by the bass component extractor 22 and processed by the absolute value processing unit 32. The output coefficient multiplier 34 multiplies an output coefficient by the absolute value exponentiated by the exponent processing unit 33. The output coefficient selector 35 selects the output coefficient to be multiplied by the output coefficient multiplier 34 according to a polarity of the input signal of the bass component extracted by the bass component extractor 2.

Figure 4:
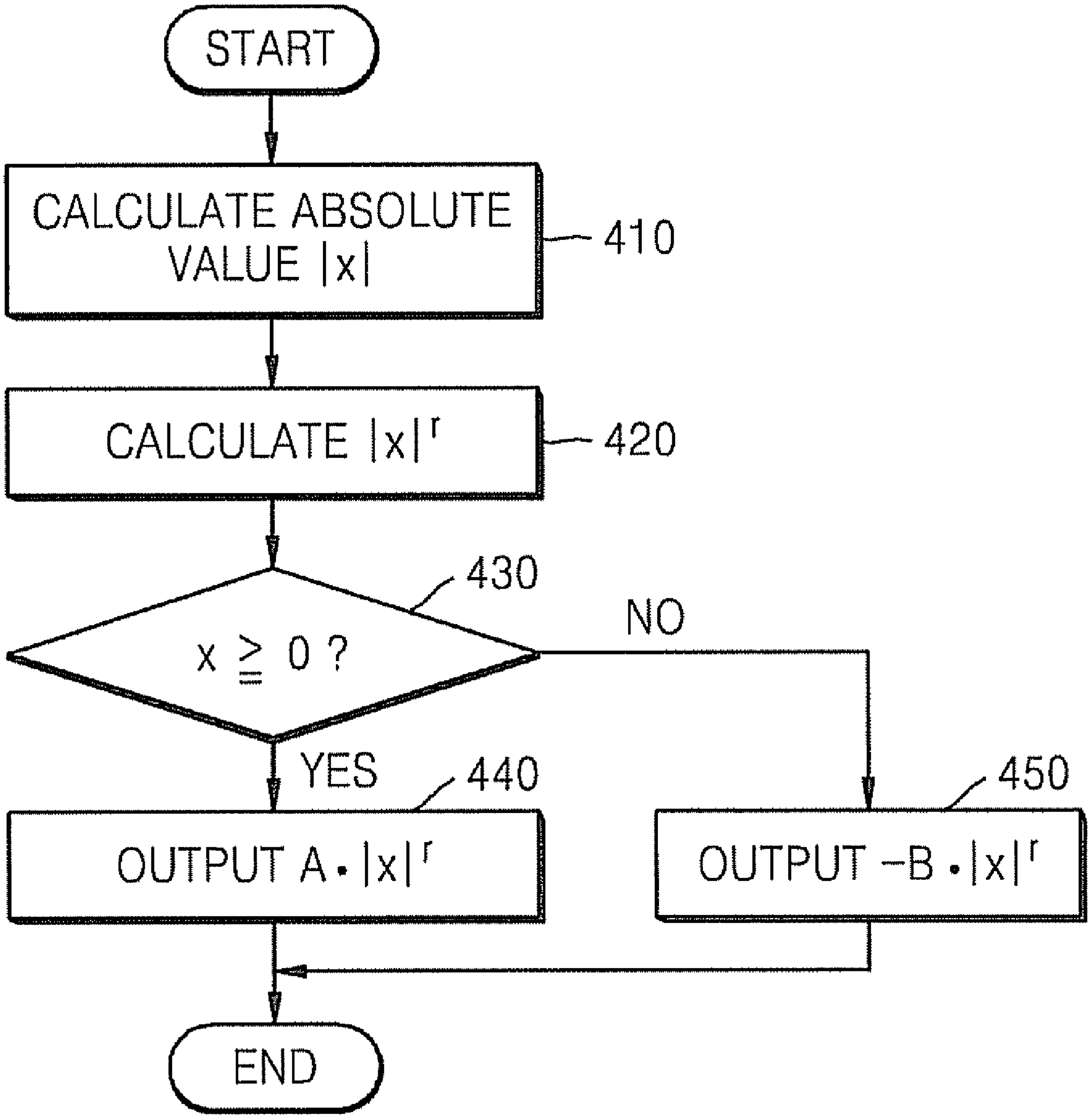
FIG. 4 is a flowchart of an operation of a harmonics generator of FIG. 3.

FIG. 4 is a flowchart of an operation of the harmonics generator 31 of FIG. 3. Referring to FIG. 4, an absolute value of a signal x input to an input terminal of the harmonics generator 31 is determined in operation 410 by the absolute value processing unit 32. The absolute value of the amplitude is exponentiated to a power of a predetermined distribution ratio r in operation 420 by the exponent processing unit 33.

The output coefficient selector 35 determines in operation 430 whether the polarity of the input signal x is positive or negative. For example, if the input signal x is greater than 0, the polarity of the input signal x is determined as positive, and if the input signal x is less than 0, the polarity of the input signal x is determined as negative.

An output coefficient A or B is selected based on the positive or negative polarity of the input signal x. The output coefficient A or B is multiplied by the exponentiated absolute value of the input signal x (i.e., the converted input signal). In detail, if the polarity of the input signal x is positive, a first coefficient A is multiplied by the exponentiated absolute value of the input signal. If the polarity of the input signal x is negative, a second coefficient B is multiplied by the exponentiated absolute value of the input signal. If the input signal x is 0, an arbitrary coefficient is selected; however, it is assumed that the first coefficient A is selected. The first and second coefficients A and B are predetermined by experiments or a user. Thus, if the polarity of the input signal x is positive, $A\cdot|x|^r$ is output in operation 440 by the output coefficient multiplier 34. If the polarity of the input signal x is negative, $-B\cdot|x|^r$ is output in operation 450 by the output coefficient multiplier 34.

Figure 5A:
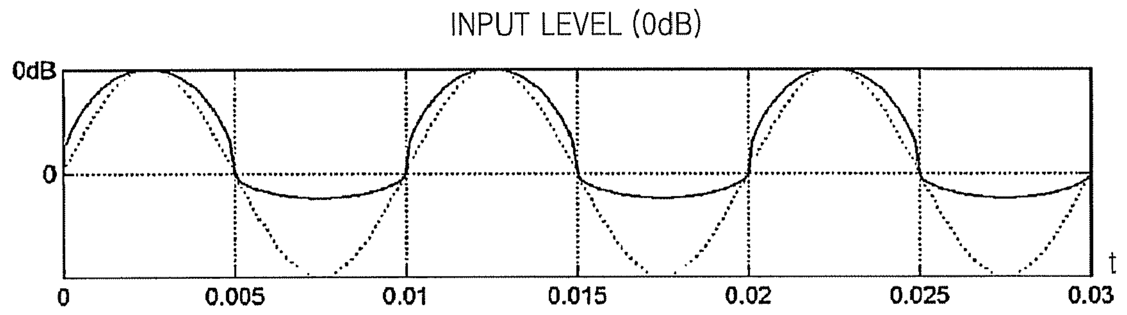
FIGS. 5A-5C illustrate waveforms processed by the harmonics generator of FIG. 3.
Figure 5B:
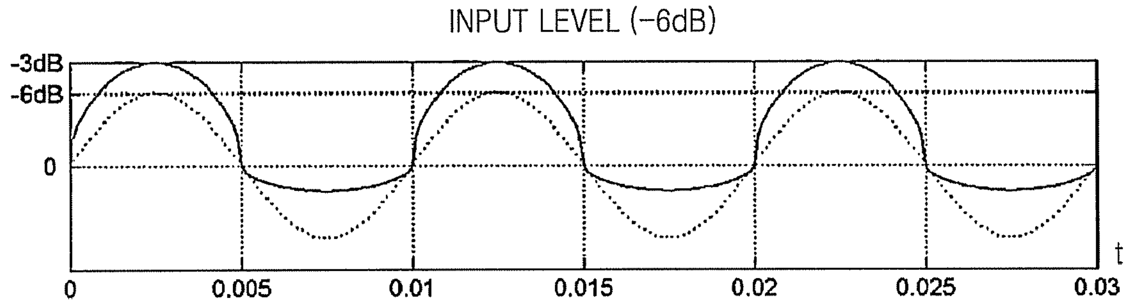
Figure 5C:
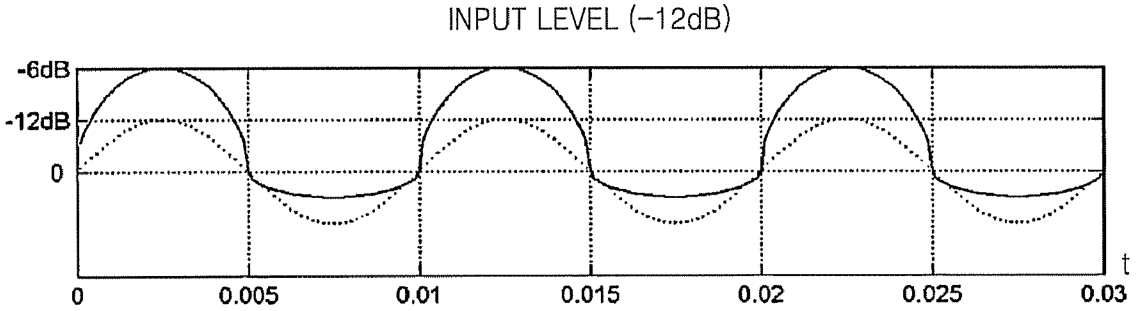

FIGS. 5A, 5B, and 5C show waveforms processed by the harmonics generator 31 of FIG. 3. It is assumed that parameters for harmonics generation are r=0.5, A=1.0, and B=−0.25. FIG. 5A shows output waveforms when an input level is 0 dB. FIG. 5B shows output waveforms when an input level is −6 dB. FIG. 5C shows output waveforms when an input level is −12 dB. Each input sine wave is represented by a dotted line, and each output waveform is represented by a solid line. In order to show that output signals resemble each other, Y-axis scales are normalized to the level of each output signal.

As illustrated in FIGS. 5A, 5B, and 5C, the output waveforms according to the input signals are the same due to the property of exponents. Thus, a distribution ratio of harmonics is constant regardless of the level of an input signal. The distribution ratio of harmonics is a relative level ratio of each harmonic component. While an input signal varies 12 dB from 0 dB to −12 dB, a signal peak level varies 6 dB from 0 dB to −6 dB. Thus, the input signal is compressed at a ratio of 0.5. Since the compression is applied to each harmonic component, each harmonic component is compressed at a ratio of r=0.5.

According to the output waveforms of FIGS. 5A, 5B, and 5C, an input sine wave is modified to a distorted output waveform by passing through the exponent processing unit 33 and the output coefficient multiplier 34 of FIG. 3. That is, the distorted output waveform is not a sine wave having a single frequency component $f_0$ but a waveform formed by synthesizing a plurality of frequency components $f_0$, $f_1$, through to $f_n$. Thus, the harmonics generator 31 of FIG. 3 generates a waveform modified due to the sum of the harmonic components by forcing distortion to an input waveform using the exponent processing unit 33 and the output coefficient multiplier 34. Of course, the exponent processing unit 33 performs compression of a dynamic range. In addition, through the exponentiation and the coefficient multiplication, a configuration and a level ratio of harmonics forming each output waveform is the same.

A level ratio of a fundamental sound to each harmonic component can be adjusted using the power r and the coefficients A and B. For example, if A is equal to B, the harmonics generator 31 generates only odd harmonics, and if A is different from B, the harmonics generator 31 generates both even harmonics and odd harmonics. The power r and the coefficients A and B may be determined by listening experiments according to a target speaker.

Figure 6A:
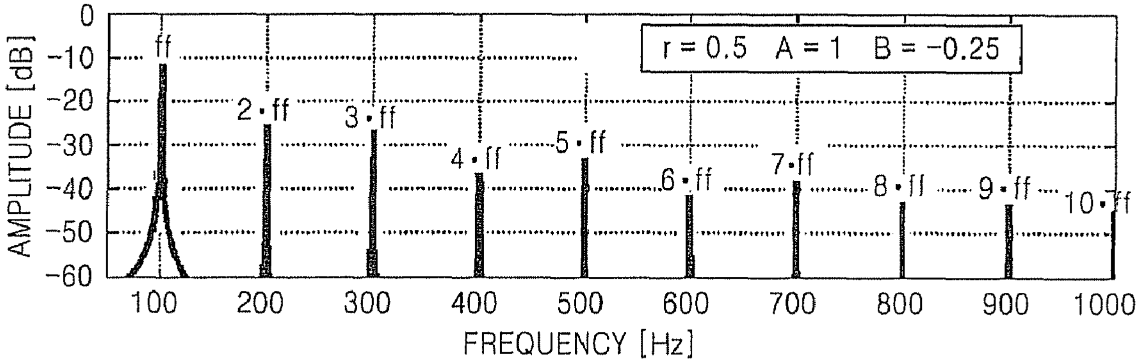
FIGS. 6A and 6B illustrate typical patterns according to a power r and coefficients A and B for harmonics generation according to aspects of the present invention.
Figure 6B:
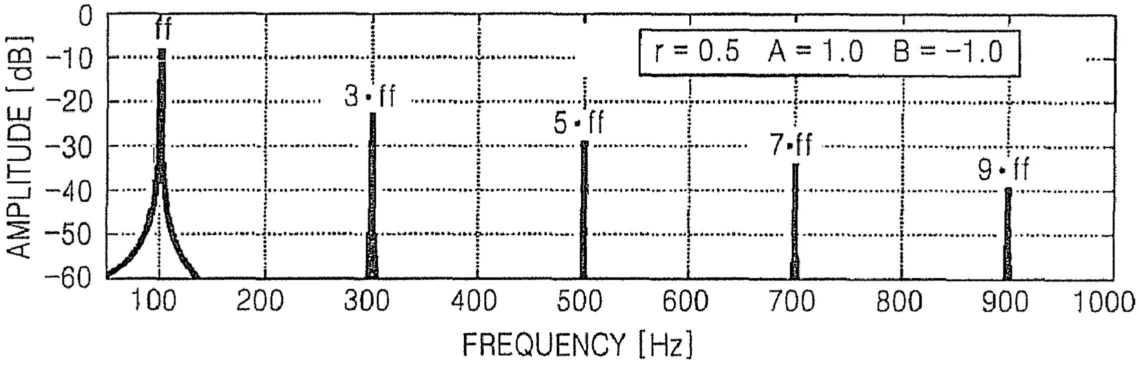

FIGS. 6A and 6B show typical patterns according to the power r and the coefficients A and B for harmonics generation according to aspects of the present invention. FIG. 6A shows a pattern containing both even harmonics and odd harmonics when $|A| \neq |B|$. FIG. 6B shows a pattern containing only odd harmonics when $|A|=|B|$, (i.e., if a magnitude of a first output gain coefficient and a magnitude of a second output gain coefficient are equal). In the pattern containing only odd harmonics, the greatest common measure (GCM) of harmonic frequencies (300 Hz, 500 Hz, 700 Hz, . . . ) is 100 Hz. Thus, since the GCM in the odd harmonics pattern is equal to an original fundamental frequency 100 Hz, a fundamental wave effect due to a missing fundamental phenomenon can be obtained.

The harmonics generation process according to aspects of the present invention can be embodied in a fixed point Digital Signal Processor (DSP). For example, the harmonics generation process can be implemented using a table lookup method in which correlations between inputs and outputs are shown. The harmonics generation process may be implemented by approximating input and output characteristics using polynomial approximation.

Figure 7:
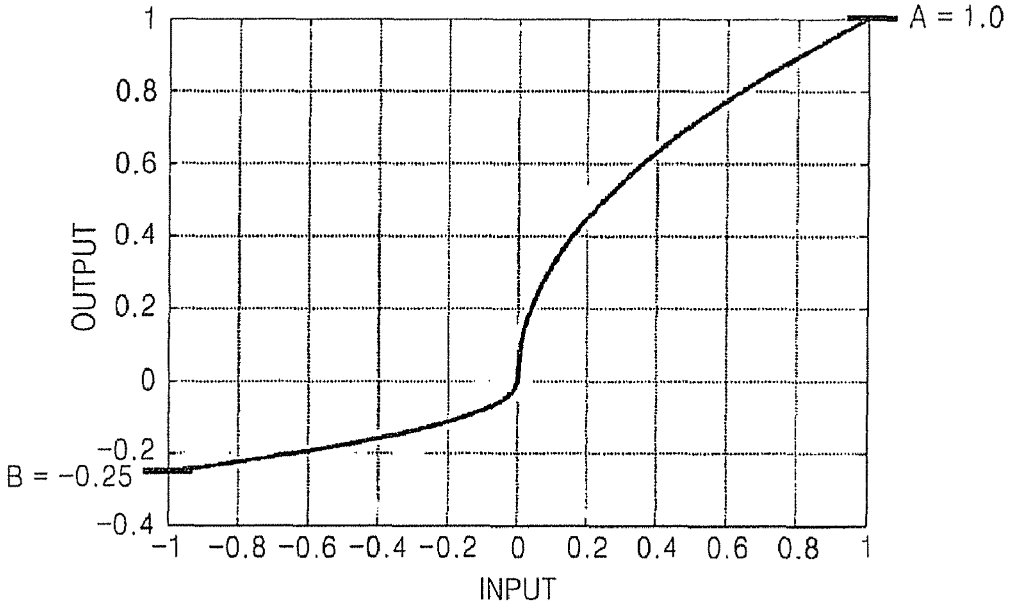
FIG. 7 illustrates a conversion table showing correlations between inputs and outputs for a harmonics generation process according to aspects of the present invention.

According to aspects of the present invention, when there is sufficient memory space, the harmonics generation process can be performed at a high speed using a lookup table or graph as illustrated in FIG. 7. FIG. 7 illustrates a conversion table showing correlations between inputs and outputs for the harmonics generation process according to aspects of the present invention. When the polarity of the input signal is −1, the output is equal to the coefficient B; whereas, when the polarity of the input signal is +1, the output signal is equal to the coefficient A.

Figure 8A:
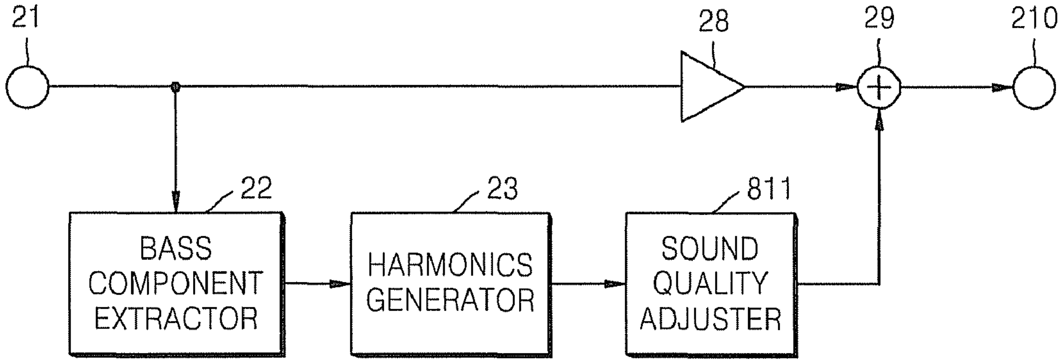
FIG. 8A is a block diagram of a bass enhancing apparatus according to aspects of the present invention.

FIG. 8A is a block diagram of a bass enhancing apparatus according to aspects of the present invention. The bass enhancing apparatus of FIG. 8A is similar to the bass enhancing apparatus of FIG. 2 and further includes a sound quality adjuster 811. The sound quality adjuster 811 may be a digital filter having a low pass characteristic to cancel harmonic components of a high order, which are generated by the harmonics generator 23, and controls the attenuation of generated harmonics. The sound quality adjuster 811 may have a high pass characteristic to cancel an original sound contained in the generated harmonics in order to prevent overload. Although FIG. 8A is illustrated as including the harmonics generator 23 of FIG. 2, it is understood that a harmonics generator according to aspects of the current invention could be included instead, i.e., the harmonics generator 31 of FIG. 3.

Figure 8B:
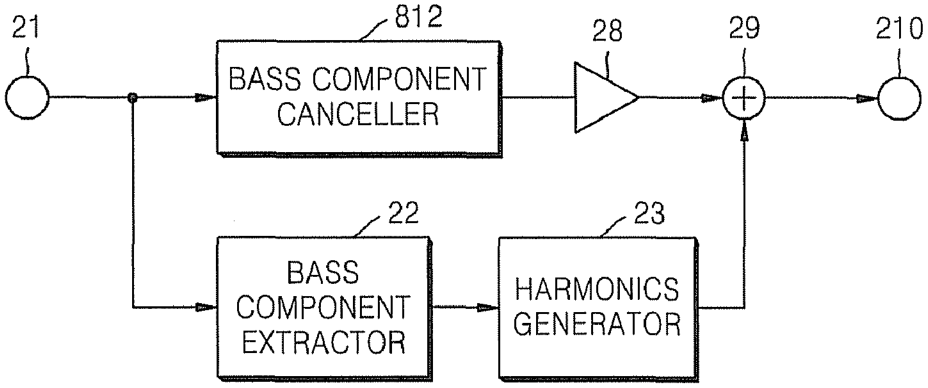
FIG. 8B is a block diagram of a bass enhancing apparatus according to aspects of the present invention.

FIG. 8B is a block diagram of a bass enhancing apparatus according to aspects of the present invention. The bass enhancing apparatus of FIG. 8B is similar to the bass enhancing apparatus of FIG. 2 and further includes a bass component canceller 812. The bass component canceller 812 may be a digital filter having a high pass characteristic and cancels components of bass from an input signal as a target speaker may not be capable of reproducing such bass. Although FIG. 8B is illustrated as including the harmonics generator 23 of FIG. 2, it is understood that a harmonics generator according to aspects of the current invention could be included instead, i.e., the harmonics generator 31 of FIG. 3.

Figure 9:
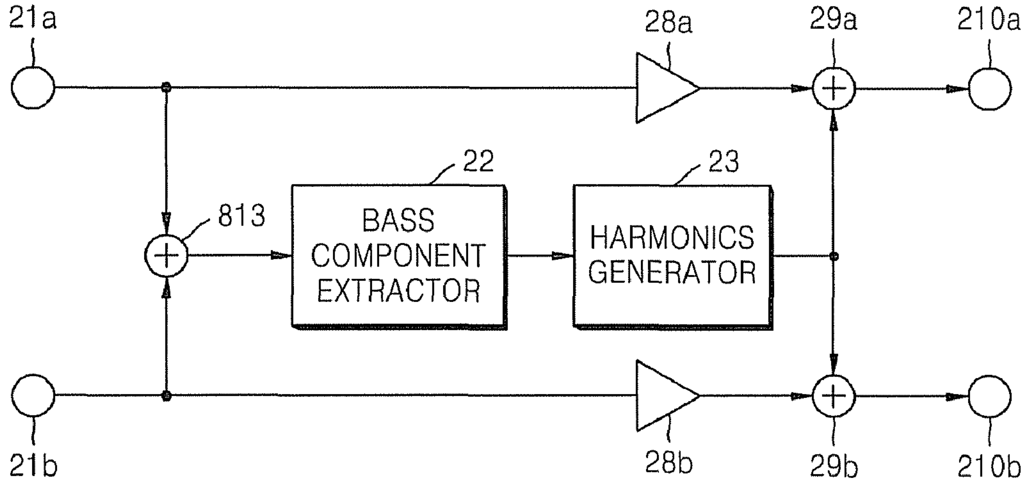
FIG. 9 is a block diagram of a bass enhancing apparatus according to aspects of the present invention.

FIG. 9 is a block diagram of a bass enhancing apparatus according to aspects of the present invention. In general, a bass component is commonly contained in input signals of two channels. Thus, as illustrated in FIG. 9, a first adder 813 mixes the input signals of the two channels. The bass component extractor 22 extracts a bass component of the mixed signal output from the first adder 813. The harmonics generator 23 generates integer-th harmonics of the bass component extracted by the bass component extractor 22 and compresses a dynamic range of an amplitude level of each harmonic component at a predetermined distribution ratio. A first gain adjuster 28*a* adjusts a gain of the signal input from a first input terminal 21*a*. A second gain adjuster 28*b* adjusts a gain of the signal input from a second input terminal 21*b*. A second adder 29*a* synthesizes each harmonic component generated by the harmonics generator 23 and the signal gain-adjusted by the first gain adjuster 28*a* and outputs the synthesizing result to a first output terminal 210*a*. A third adder 29*b* synthesizes each harmonic component generated by the harmonics generator 23 and the signal gain-adjusted by the second gain adjuster 28*b* and outputs the synthesizing result to a second output terminal 210*b*. Although FIG. 9 is illustrated as including the harmonics generator 23 of FIG. 2, it is understood that a harmonics generator according to aspects of the current invention could be included instead, i.e., the harmonics generator 31 of FIG. 3.

It is understood that aspects of the invention can be embodied as computer readable codes on a computer readable recording medium. The computer readable recording medium may be any data storage device that can store data which can be thereafter read by a computer system. Examples of the computer readable recording medium include read-only memory (ROM), random-access memory (RAM), CD-ROMs, magnetic tapes, floppy disks, and optical data storage devices. Further, it is understood that aspects of the invention may be transmitted through a wired or wireless network or connection. The computer readable recording medium may also be distributed over network coupled computer systems so that the computer readable code is stored and executed.

As described above, according to aspects of the present invention, by compressing a dynamic range of each harmonic component generated from a bass component, a bass enhancing effect in a common level duration can be increased, and signal distortion in a peak level duration can be reduced. In addition, since a distribution ratio of harmonics is maintained constant, a tone change due to the compression of a dynamic range can be minimized. In addition, by implementing a harmonics generation process and a dynamic range compression process in one body, a circuit scale can be minimized, and error occurrence in the processes can be minimized.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A bass enhancing apparatus, comprising:

a bass component extractor to extract a bass component of an input signal;

a harmonics generator to generate a plurality of harmonics of the bass component extracted by the bass component extractor and to compress a dynamic range of an amplitude level of each harmonic component at a predetermined distribution ratio; and at least one output synthesizer to synthesize the plurality of harmonic signals generated by the harmonics generator and the input signal.

2. The bass enhancing apparatus of claim 1, wherein the harmonics generator comprises:

an absolute value processing unit to determine an absolute value of the amplitude of the bass component extracted by the bass component extractor;

an exponent processing unit to exponentiate the absolute value of the amplitude determined by the absolute value processing unit;

an output coefficient multiplier to multiply an output coefficient by the signal output from the exponent processing unit; and an output coefficient selector to select the output coefficient multiplied by the output coefficient multiplier according to the polarity of the input signal.

3. The bass enhancing apparatus of claim 1, further comprising a sound quality adjuster to adjust the predetermined distribution ratio of harmonics of harmonic components generated by the harmonics generator.

4. The bass enhancing apparatus of claim 3, wherein the sound quality adjuster is a digital filter having a low pass characteristic or a high pass characteristic.

5. The bass enhancing apparatus of claim 1, further comprising a bass component canceller to cancel a bass component of the input signal.

6. The bass enhancing apparatus of claim 5, wherein the bass component canceller is a digital filter having a high pass characteristic.

7. The bass enhancing apparatus of claim 1, wherein the harmonics generator comprises:

an integer-th harmonics generator to generate a second harmonic to an nth harmonic of the bass component extracted by the bass component extractor;

a dynamic range compressor to compress a dynamic range of an amplitude level of each harmonic component generated by the integer-th harmonics generator; and a gain adjuster to adjust a gain of each harmonic component output from the dynamic range compressor.

8. The bass enhancing apparatus of claim 1, further comprising:

an input synthesizer to synthesize a plural number of input signals into a synthesized input signal, wherein the bass component extractor extracts the bass component of the synthesized input signal.

9. The bass enhancing apparatus of claim 8, further comprising:

a first gain adjuster to adjust a gain of a first input signal of the plural number of input signals; and a second gain adjuster to adjust a gain of a second input signal of the plural number of input signals.

10. The bass enhancing apparatus of claim 8, where the at least one output synthesizer comprises:

a first output synthesizer to synthesize each harmonic component generated by the harmonics generator and the gain-adjusted first input signal from the first gain adjuster and to output the first synthesizing result to a first output terminal; and a second output synthesizer to synthesize each harmonic component generated by the harmonics generator and the gain-adjusted signal from the second gain adjuster and to output the second synthesizing result to a second output terminal.

11. The bass enhancing apparatus of claim 1, further comprising:

a first gain adjuster to adjust a gain of the input signal before the input signal is synthesized with the plurality of harmonic signals generated by the harmonics generator.

* * * * *